United States Patent [19]

Silvestri et al.

[11] 4,425,574

[45] Jan. 10, 1984

[54] BURIED INJECTOR MEMORY CELL FORMED FROM VERTICAL COMPLEMENTARY BIPOLAR TRANSISTOR CIRCUITS AND METHOD OF FABRICATION THEREFOR

[75] Inventors: Victor J. Silvestri, Mount Kisco; Denny D. Tang, Yorktown Heights; Siegfried K. Wiedmann, Peekskill, all of N.Y.

[73] Assignee: International Business Machines Corporation, Armonk, N.Y.

[21] Appl. No.: 272,877

[22] Filed: Jun. 12, 1981

Related U.S. Application Data

[62] Division of Ser. No. 53,486, Jun. 29, 1979, Pat. No. 4,274,891.

[51] Int. Cl.³ ........................................... H01L 27/02
[52] U.S. Cl. ...................................... 357/50; 357/49; 357/59; 357/44
[58] Field of Search ...................... 357/44, 42, 49, 59, 357/50

[56] References Cited

U.S. PATENT DOCUMENTS

| | | | |
|---|---|---|---|
| 4,155,778 | 5/1979 | Antipov | 357/50 X |
| 4,159,915 | 7/1979 | Anantha et al. | 357/50 X |
| 4,196,440 | 4/1980 | Anantha et al. | 357/44 X |
| 4,214,315 | 7/1980 | Anantha et al. | 357/44 |
| 4,249,193 | 2/1981 | Balyoz | 357/50 X |
| 4,252,582 | 2/1981 | Anantha et al. | 357/50 X |

*Primary Examiner*—Martin H. Edlow
*Attorney, Agent, or Firm*—Thomas J. Kilgannon

[57] ABSTRACT

A vertical pair of complementary, bipolar transistors is disclosed which includes a semiconductor substrate of one conductivity type and a pair of dielectric isolation regions disposed in contiguous relationship with the substrate. An injector region of opposite conductivity type is disposed between the pair of isolation regions. A pair of heavily doped, polycrystalline, semiconductor regions of the one conductivity type is disposed over and in registry with the pair of isolation regions. Similarly, a single crystal, semiconductor region of the one conductivity type is disposed over and in registry with the injector region. Finally, a first zone of opposite conductivity type is disposed in the single crystal region and a second zone of the one conductivity type is disposed in the first zone. To form a memory cell, another vertical pair of complementary, bipolar transistors like those just described is disposed in electrically isolated, spaced relationship with the first mentioned vertical pair of complementary, bipolar transistors. These pairs of transistors are arranged so that an isolation region and a polycrystalline region of each are common. To form the memory cell, the first and second zones of each of the pairs are cross-coupled.

In addition, a method of manufacturing a semiconductor device having vertical complementary, bipolar transistors is disclosed which includes the steps of forming regions of dielectric isolation which are contiguous with a semiconductor substrate and a region of semiconductor of one conductivity type therebetween, the semiconductor substrate being of opposite conductivity type; forming regions of heavily doped, polycrystalline semiconductor of the opposite conductivity type and a region of single crystal semiconductor of the opposite conductivity type in registry with the regions of dielectric isolation and the semiconductor region of one conductivity type, respectively. The method also includes the step of forming a zone of one conductivity type in the region of single crystal semiconductor and a zone of opposite conductivity type in the zone of one conductivity type. The details of each of the above steps are also disclosed. The fabrication of a buried injector, memory cell which includes steps similar to those just described is also disclosed.

7 Claims, 10 Drawing Figures

4,425,574

BURIED INJECTOR MEMORY CELL FORMED FROM VERTICAL COMPLEMENTARY BIPOLAR TRANSISTOR CIRCUITS AND METHOD OF FABRICATION THEREFOR

This is a division, of application Ser. No. 053486 filed June 29, 1979 now U.S. Pat. No. 4,274,891.

DESCRIPTION

1. Technical Field

This invention relates to circuits have complementary bipolar transistors (such as MTL) and more particularly relates to a memory cell formed from such circuits which has improved density over known memory cells. The density improvement results from the use of buried injectors which form bit-lines for the resulting memory cell and from the reduction of bit-line contacts from two per memory cell to two per pair of bit-lines. The invention also relates to the method of fabricating circuits having vertical, complementary, bipolar transistors which, in particular, results in the structure of a memory cell for use in a high density memory array.

2. Background Art

MTL storage cells made from a pair of cross-coupled inverter stages are already well known. An example of such a memory cell is shown in IBM Technical Disclosure Bulletin, Vol. 21, No. 1, June, 1978, p. 231, in an article entitled "MTL Storage Cell" by S. K. Wiedmann. The equivalent circuit of the prior art storage cell is identical with the equivalent circuit of the memory cell of the present application. However, the injection zones of the basic structure are arranged laterally of the inverting transistor structures which with switching transistors form inverter stages. The injection zones are each connected to a separate bit-line via a pair of contacts for each memory cell. Because the injectors are laterally positioned with respect to the vertically arranged inverting transistor, the areal requirements are greater than if the inverter stages were totally vertically arranged as taught by the present application. The memory cell of the present application which includes a pair of totally vertical arranged inverter stages, has areal requirements which are approximately half those of the prior art memory cell. This results from the use of a pair of inverter stages each of which has a vertically arranged injector requiring only two contacts per pair of injectors which are common bit-lines to a plurality of memory cells in the same column of a memory array. Finally, all the elements of the prior art inverter stages are formed by masking and then diffusing appropriate dopants into a single layer of semiconductor material. This process requires very tight alignment tolerances to achieve even the densities which can be obtained. The present process does not suffer from strict mask alignment tolerances inasmuch as certain of the process steps result in self-aligned regions which avoid the use of masks entirely.

U.S. Pat. No. 4,087,900, filed Oct. 18, 1976, entitled "Fabrication of Semiconductor Integrated Circuit Structure Including Injection Logic Configuration Compatible With Complementary Bipolar Transistors Utilizing Simultaneous Formation of Device Regions" discloses a process whereby both the switching transistor and the current source transistor are of the vertical type. To the extent that the contacts to the vertical structure shown are all at the surface of a semiconductor layer and that semiconductor regions are used for isolation zones, the structure and method of fabrication of the vertical complementary bipolar transistors are completely different from the structure and method of fabrication of the circuit arrangements of the present application.

U.S. Pat. No. 3,912,555, filed Sept. 18, 1973 and entitled "Semiconductor Integrated Circuit and Method for Manufacturing the Same" shows an NPN transistor and a PNP transistor formed in a common semiconductor chip in a vertical type arrangement. Both transistors have buried collector layers each being under a base area. While this reference suggests that complementary type transistors are formed in a vertical type arrangement, both the NPN and PNP transistor are formed in separate areas and do not form a vertical inverter circuit of the type disclosed in the present application. In other words, the circuit does not use a pair MTL inverters to form a memory cell nor does it use a process which includes the forming of dielectric isolation.

Accordingly, it is a principal object of the present invention to provide vertical, complementary bipolar transistors circuits in which all the regions of the transistor pairs are isolated from corresponding regions of another similar pair of transistors.

It is another object of the present invention to provide vertical, complementary bipolar transistors which when interconnected form a memory cell which is two times smaller than known memory cells.

It is another object of the present invention to provide a memory cell the buried injectors of which act as bit-lines for the memory cell.

It is another object of the present invention to provide a method of fabricating buried injector memory cells, the injectors of which are isolated from each other and from adjacent injectors by dielectric isolation regions.

Still another object of the present invention is to provide a process for fabricating memory cells formed from vertical, complementary, bipolar transistor circuits. The buried injectors, single crystal regions and associated polycrystalline regions of which are self-aligned as a result of the presence of dielectric regions.

BRIEF SUMMARY OF THE INVENTION

A vertical pair of complementary bipolar transistors is disclosed which includes a semiconductor substrate of one conductivity type and a pair of dielectric isolation regions disposed in contiguous relationship with the substrate. An injector region of opposite conductivity type is disposed between the pair of isolation regions. A pair of heavily doped, polycrystalline, semiconductor regions of the one conductivity type is disposed over and in registry with the pair of isolation regions. Similarly, a single crystal, semiconductor region of the one conductivity type is disposed over and in registry with the injector region. Finally, a first zone of opposite conductivity type is disposed in the single crystal region and a second zone of the one conductivity type is disposed in the first zone. To form a memory cell, another vertical pair of complementary, bipolar transistors like those just described is disposed in electrically isolated, spaced relationship with the first mentioned vertical pair of complementary, bipolar transistors are arranged so that an isolation region and a polycrystalline region of each are common. To form the memory cell, interconnection means cross-couple a first zone of the first of the vertical pairs of complementary, bipolar transistors with a second zone of the other vertical pair of complementary, bipolar transistors and cross-couple a second zone of the first vertical pair of complementary, bipolar transistors with a first zone of the other pair of complementary, bipolar transistors. Potential sources connected to one of the polycrystalline regions and to the injector regions apply signals via the injector regions and polycrystalline regions to set the state of the cell.

A method of manufacturing a semiconductor device having vertical complementary, bipolar transistors is also disclosed which includes the steps of forming regions of dielectric isolation which are contiguous with a semiconductor substrate and a region of semiconductor of one conductivity type therebetweeen, the semiconductor substrate being of opposite conductivity type; forming regions of heavily doped, polycrystalline semiconductor of the opposite conductivity type and a region of single crystal semiconductor of the opposite conductivity type in registry with the regions of dielectric isolation and the semiconductor region of one conductivity type, respectively. The method also includes the step of forming a zone of one conductivity type in the region of single crystal semiconductor and a zone of opposite conductivity type in the zone of one conductivity type. The regions of dielectric isolation and a region of semiconductor of one conductivity type may be formed by masking the semiconductor substrate to expose at least two surface portions and applying an etchant to them to etch depressions in the substrate. The depressions are then filled with dielectric material and a dopant is introduced into the substrate to form a region of one conductivity type between the depressions. Alternately, the dielectric regions may be formed by depositing a dielectric material and etching it to expose a surface portion of the substrate.

The heavily doped polycrystalline regions and a region of single crystal semiconductor are formed by depositing a layer of semiconductor material of opposite conductivity type on the dielectric isolation and on the semiconductor region of one conductivity type to form polycrystalline regions and a single crystal region on the dielectric isolation and on the region of one conductivity type, respectively. The region of one conductivity type is then masked and a dopant of opposite conductivity type is introduced into the polycrystalline regions to render the polycrystalline regions conductive.

The zones of one conductivity type and opposite conductivity type are formed in the single crystal semiconductor region by oxidizing the regions of heavily doped polycrystalline and single crystal semiconductor to form an oxide layer having thick portions over the polycrystalline regions and a thin oxide over the single crystal region. The layer is then etched to remove the thin oxide portions and first and second dopants of opposite and said one conductivity type are introduced into the region of single crystal semiconductor in sequence to form the zones therein. Alternatively, the thin oxide layer can be patterned and dopant introduced in sequence.

The method of fabricating the memory cell includes the step of cross-coupling elements of a pair of vertical complementary, bipolar transistors to form a flip-flop and applying word and bit-line potentials to a polycrystalline region and a pair of injectors, respectively to provide a buried injector memory cell the areal requirements of which are half those of prior art memory cells.

These and other objects, features and advantages will be more apparent from the following more particular description of the preferred embodiments.

DETAILED DESCRIPTION OF THE PREFERRED EMBODIMENT

Figure 1A:
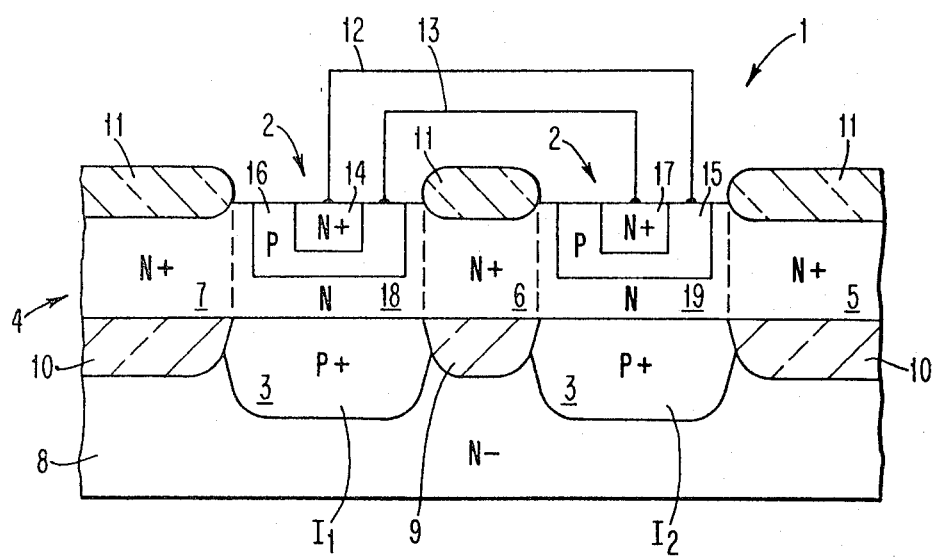
FIG. 1A is a partially schematic, cross-sectional view of a buried injector MTL (Merged Transistor Logic) memory cell which includes a pair of cross-coupled inverter circuits which include buried injectors and constitute an MTL memory cell. The buried injectors are bit-lines for the memory cell which are electrically isolated from each other by dielectric isolation regions. The cell word-line is arranged perpendicularly to the bit-lines and is formed from the same deposited layer of semiconductor in which the NPN transistors are also formed. The resulting structure requires a smaller area per cell than known memory cells of a similar type because of the buried injectors or bit-lines utilized in the memory cell.

Referring now to FIG. 1, there is shown a partially schematic, cross-sectional view of a buried injector MTL (Merged Transistor Logic) memory cell 1. FIG. 1A shows a memory cell 1 which is but a single memory cell formed in a semiconductor substrate which contains hundreds and even thousands of such memory cells arranged in array form. Memory cell 1 includes a pair of cross-coupled inverter circuits each of which includes a pair of complementary, bipolar transistors 2. Devices 2 include a pair of injectors 3 which constitute the bit-lines of memory cell 1. The NPN devices of transistor pairs 2 of cell 1 are formed in relatively lightly doped portions of an otherwise heavily doped layer 4 of N-conductivity type silicon. Portions 5, 6, 7, for example, are highly electrically conductive because they are heavily doped and are part of a word-line; portion 6 of which interconnects pairs of transistors 2 and portions 5, 7 of which connect memory cell 1 to other memory cells 1 (not shown). Injectors 3 which are the bit-lines of memory cell 1, are regions of heavily doped, P-conductivity type formed in a substrate 8 which is a wafer of lightly doped, N-conductivity type semiconductor such as silicon. Injectors 3 which form a part of each of the PNP transistors of transistor pairs 2 as will be shown below are electrically isolated from each other by a region of semiconductor oxide 9 and from injectors 3 of adjacent memory cells 1 (not shown) by semiconductor oxide regions 10. In FIG. 1, semiconductor oxide regions 11 are formed atop portions 5, 6, 7, of layer 4. Interconnections 12, 13 shown schematically in FIG. 1A interconnect an N-region 14 of leftmost transistor pair 2 with a P-region 15 of rightmost transistor pair 2 and a P-region 16 of leftmost transistor pair 2 with an N-region 17 of rightmost transistor pair 2, respectively. Since interconnections 12, 13 form no part of the present invention, they have been shown schematically. Also, to the extent that interconnections 12, 13 must be connected with only a single transistor region, in a practical embodiment, interconnections 12, 13 would lie atop an oxide in which holes are formed to permit connection to an underlying P or N region. N-conductivity type regions 18, 19 are regions of single crystal semiconductor disposed over injectors 3 and are common zones in each of transistor pairs 2. Thus, region 18 is a zone in the NPN transistor formed by regions 14, 16, 18 and a zone in PNP transistor formed by 3, 18, 16. Region 19 is similarly common in the rightmost of transistor pairs 2.

Figure 1B:
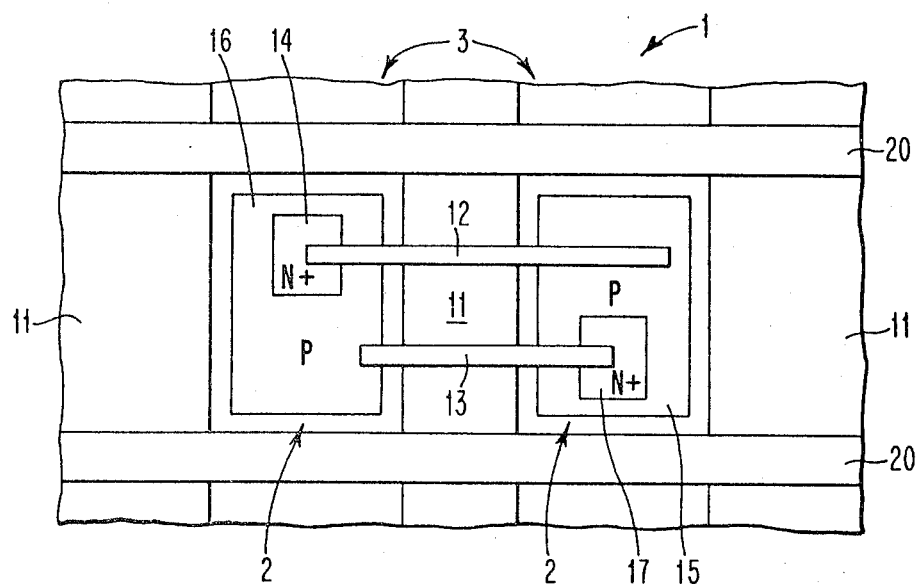
FIG. 1B is a partial schematic, top view of the memory cell of FIG. 1A which shows the layout of the various regions of the NPN transistors; the perpendicular relationship of the word-line to the bit-lines and, the oxide regions surrounding the memory cell which electrically isolate it from other cells which are either connected to the same word-line or bit-lines.

Referring now to FIG. 1B, there is shown a top view of MTL memory cell 1; the cross-section of which is shown in FIG. 1A. FIG. 1B shows the layout of memory cell 1 and further shows trenches 20 of isolation oxide which extends from the upper surface of layer 4 to a point where the oxide touches injectors 3. In this way, memory cell 1 is surrounded by either semiconductor oxide 11 or portions of trenches 20 of isolation oxide. Also, referring again to FIG. 1A, bit-lines or injectors 3 are isolated from adjacent injectors 3 by regions of semiconductor oxide 10. In FIG. 1A, portion 6 of layer 4 effectively electrically isolates leftmost transistor pair 2 from rightmost transistor pair 2 because any holes which appear in portion 6 are eliminated by recombination in heavily doped region 6 which is polycrystalline in character. The N-conductivity type regions 18, 19 immediately atop injectors 3 are single crystal in character while highly doped N+ portions 5-7 of layer 4 are polycrystalline in character as a result of the presence of underlying semiconductor oxide regions 9, 10. Layer 4 is ultimately connected to a source of word-line potential while injectors 3 are each connected to a separate source of bit-line potentials.

Considering now the overall structure disclosed in FIG. 1A, the vertical structure of NPN-PNP transistor pairs 2 can now be seen. Thus, regions 14, 16, 18 form the NPN structure of leftmost transistor pair 2 while regions 16, 18 and leftmost injector 3 form the PNP structure of leftmost transistor pair 2. Similarly, regions 15, 17, 19 form the NPN structure of rightmost transistor pairs 2 while regions 15, 19 and rightmost injector 3 form the PNP structure of rightmost transistor pair 2. At this point, it should be appreciated that, in addition to the pairs of transistors being electrically isolated from each other, layer 4 portions of which act as a word-line for memory cell 1 is electrically isolated from substrate 8 by the combination of dielectric isolation regions 9, 10 and injectors 3.

Figure 2:
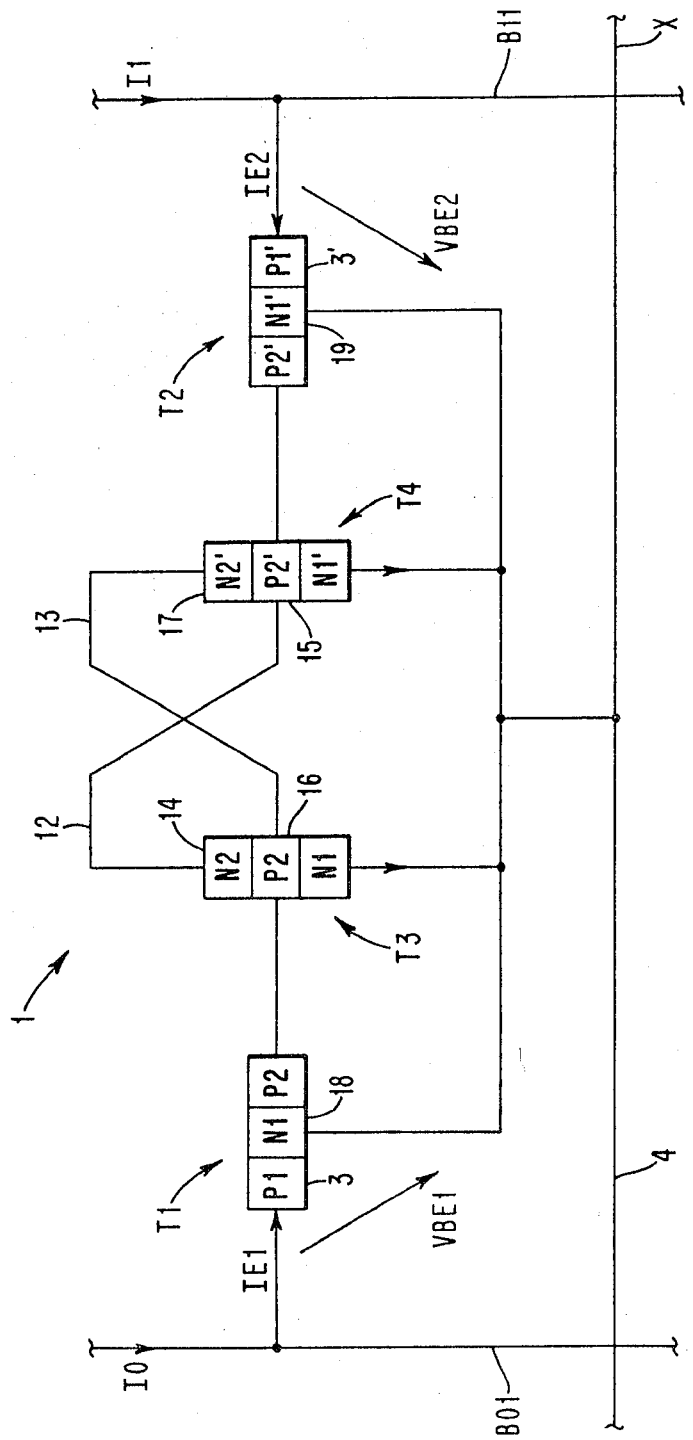
FIG. 2 is a schematic diagram showing the equivalent circuit of the bipolar, cross-coupled memory cell of FIGS. 1A, 1B.

Referring now to FIG. 2, there is shown an equivalent circuit diagram of a bipolar, cross-coupled storage cell, the structure of which is embodied in FIGS. 1A, 1B. The equivalent circuit is already well known as evidenced by the same equivalent circuit shown in FIG. 1 of the IBM Technical Disclosure Bulletin, Vol. 21, No. 1, June, 1978, p. 231, entitled "MTL Storage Cell" by S. K. Wiedmann and discussed in the prior art section hereinabove. Elements in FIG. 2 which are the same as in FIGS. 1A, 1B have been given the same reference characters. Circuit 1 of FIG. 2 operates as follows: In the standby state, address line 4, otherwise identified as address line X in FIG. 2, and all other similar address lines of an array have the same potential. This potential may be, for example 0.5 volts. Two bit-lines B01, B11, are connected to injectors 3 and to a potential which is about 0.7 volts higher than that of address line 4. The potential of bit-lines B01, B11 is controlled in such a way that the same current IE1=IE2 flows in all in the injecting transistors T1, T2 which simultaneously form the load transistors. This holds for base-emitter voltages VBE1=VBE2. If the current amplification of transistors T3, T4 of FIG. 2 in emitter configuration is greater than 1, the flip-flop adopts a stable state, whereby the chosen standby current of memory cell 1 can be very low.

To address memory cell 1, the potential of address line 4 is lowered, for example, to zero volts.

To read memory cell 1, two different operating modes can be utilized. A read operation may be achieved by applying the same potential to both bit-lines B01, B11 so that the two injecting and load transistors T1, T2 carry the same current IE1=IE2. The value of these currents is preferably chosen higher than that in the standby state in order to achieve higher speed of operation. Any non-selected cell connected to the same bit-line pair is substantially cut off from the power supply during this reading step since the emitter-base voltage of transistors T1, T2 is several hundred millivolts lower than the emitter-base voltage of flip-flop transistors T3, T4 of the selected address line 4. However, relative to the read time, the information of non-selected storage cells is maintained for a relatively long time by the stored charge in the flip-flop transistor capacitances. If flip-flop transistor T3 is conductive and flip-flop transistor T4 is non-conductive, an emitter current flows in transistor T1, while no such current flows in transistor T2. There is also a current transistor T1 that is reinjected when inverting transistor T3 is conductive. Under such circumstances, though the structure of transistor T1 is the same, the emitter and collector functions are interchanged. In this manner, means are obtained for sensing the conductive state of inverting transistor T3 without additional lines or semiconductor zones being added to the existing memory cell structure. Thus, a reinjected current flows in transistor T1 back into bit-line B01 so that a current IO equal to IE1 minus the reinjected current flows in the bit-line. The current flowing in bit-line B11 is I1=IE2. This results in a current difference $\Delta I = I1 - I0$. This difference can be measured by means of sensing circuits in the form of a low resistivity amplifier, for example, which indicates the storage state of memory cell 1. In another mode using forced equal bit-line currents, a voltage difference is obtained which can be amplified by means of a differential amplifier connected to the bit-lines which also provides an output which indicates the storage state of memory cell 1.

A write operation is achieved as follows: As in the instance of a read operation, address line 4 is reduced to about zero volts. A current is applied to one of the two bit-lines B01, B11. If, for example, flip-flop transistor T4 is to be made conductive, then a current I1 is applied to bit-line B11 only. A large part of the current I1 flows into base 15 of transistor T4, switching that device. In this way, the storage state of the cell is set.

Referring now to FIGS. 3A–3G, memory cell 1 is shown in various intermediate stages of the process for its fabrication. Elements which are the same as the elements of FIGS. 1A, 1B have been given the same reference characters in FIGS. 3A–3G. While it is recognized that the structure and process of the present invention could have been described in connection with an inverter circuit consisting of the transistor pairs 2 of memory cell 1 alone, the structure has been described and the process will be described in connection with a memory cell for it is in this environment that the greatest savings in density are realized. One skilled in the structures and fabrication procedures of the semiconductor art will have no difficulty in recognizing either the inverter circuits contained in the memory cell of the present invention or their method of fabrication.

Figure 3A:
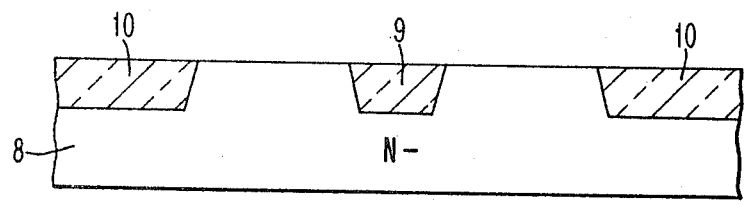
FIGS. 3A–3G show cross-sectional views of a semiconductor substrate at various intermediate states in the process of fabricating the buried injector MTL memory cell of the present invention.

FIG. 3A shows a N-silicon substrate 8 into which regions 9, 10 of dielectric isolation have been formed. Regions 9, 10 of dielectric isolation are, for example, Recessed Oxide (ROX) formed in silicon substrate 8 using well-known techniques. To form a recessed oxide region, an adherent oxidation barrier layer such as silicon nitride, aluminum nitride, boron nitride, aluminum oxide or silicon carbide is delineated and positioned over those regions wherein devices are to be subsequently fabricated. Preferably, the oxidation barrier is a silicon nitride and is approximately 300–1000 Å thick, preferably 700 Å thick.

The layer of silicon nitride may be deposited by conventional Chemical Vapor Deposition (CVD) techniques. Additional thin silicon dioxide layers may be provided above and below the silicon nitride layer to aid in the delineation of the silicon nitride layer and to prevent damage to the underlying regions of silicon substrate 8 wherein devices or portions thereof are to be subsequently formed. The layer of silicon dioxide underneath the silicon nitride layer is approximately 300 to 1000 Å thick, preferably 400 Å thick and is formed by CVD or, preferably, by thermal oxidation in dry oxygen at a temperature of approximately 900° to 1000° C. preferably 950° C. The silicon dioxide layer over the silicon nitride layer is approximately 300 to 1000 Å thick, preferably 500 Å, and is formed by CVD.

A pattern determining layer such as a layer of photoresist material of the type employed in known photolithographic masking and etching techniques is then placed over the surface of the upper thin oxide layer. Any of the well-known photosensitive, polymerizable resist materials known in the art may be used. The resist layer is approximately 10,000 Å thick. The resist material layer is applied as by spinning on or by spraying. The photoresist is then dried and portions thereof are selectively exposed to ultraviolet radiation through a photolithographic mask in a well-known manner. This mask is of a transparent material having opaque portions in a predetermined pattern. The mask substrate 8 is then subjected to ultraviolet light, polymerizing the portions of the resist material underlying the transparent regions of the mask. After removal of the mask, substrate 8 is rinsed in a suitable developing solution which washes away the portions of the resist material which were under the opaque regions of the mask and thus, not exposed to the ultraviolet light. The resulting assembly may then be baked to further polymerize and harden the remaining resist material which conforms to the desired pattern, i.e, it covers regions of substrate 8 in which devices or portions thereof are to be subsequently formed. Next, substrate 8 is treated to remove the portions of the upper silicon dioxide layer not protected by the remaining portions of the photoresist layer. Substrate 8 is immersed in a solution of buffered hydrofluoric acid. This etching solution etches the thus exposed portions of the upper silicon dioxide layer but does not attack the remaining portions of the resist layer or the silicon nitride layer. The remaining portions of the photoresist layer above the now etched oxide layer are removed by dissolving in a suitable solvent. The remaining silicon dioxide portions of the upper oxide layer conform to a predetermined pattern and now serve as a mask for etching predetermined patterns in the silicon nitride layer. The lower silicon oxide layer, if present, serves as a pad or gasket to prevent strain damage to the underlying silicon substrate by the nitride layer.

Patterns in silicon nitride layer can be formed by etching in a phosphoric acid solution at a 180° C. Phosphoric acid does not attack the other materials on substrate 8. The underlying silicon oxide layer can now be etched in a suitable etchant to expose portions of the surface of substrate 8. Then, with the nitride mask portions still in place, an anisotropic etching step using a known pyrocatecol etchant is used to etch out depressions in substrate 8. Then, recessed isolation oxide regions are formed in these depressions by thermal oxidation in the presence of dry oxygen or steam. Preferably, the isolation oxide is formed by thermal oxidation and steam at a temperature of about 900°–1000° C., preferably 950° C., to a thickness of about 4000–2000 Å, preferably 6500 Å. At this point, silicon nitride and underlying silicon oxide layer portions are removed by suitable well-known etchants and the resulting structure is as shown in FIG. 3A.

The teaching of the present application is not limited however, to the steps discussed thus far. A similar structure can be obtained by forming depressions in substrate 8 by the known technique of Reactive Ion Etching. The resulting depressions can then be filled by Chemical Vapor Deposition (CVD) of insulating materials such as silicon oxide, silicon nitride or, for that matter, any conveniently deposited dielectric material.

The teaching of the present application is also not limited to the particular structure shown in FIG. 3A. Thus, isolation regions 9, 10 instead of being fully recessed oxide may be semi-recessed oxide. In the latter instance, oxide extends from the depressions in substrate 8 to a height greater than the thickness of substrate 8. Alternatively, a layer of dielectric material may be deposited and patterned such that dielectric portions are contiguous with substrate 8. Whether recessed, semi-recessed or atop substrate 8, the isolation regions are functionally the same and the remaining process steps are the same. Because of this, and because the use of recessed oxide provides a planar structure, the remaining steps will be described using the recessed oxide configuration of FIG. 3A as a starting point.

Figure 3B:
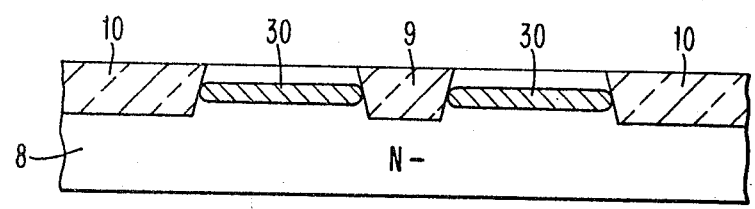

Referring now to FIG. 3B, there is shown a cross-sectional view of substrate 8 in a later intermediate state after a dopant has been ion implanted into the substrate regions lying between isolation regions 9, 10 of recessed oxide. The ion implantation of a P-type dopant such as boron forms regions 30 in between isolation regions 9, 10. The depth of the ion implant is a function of the voltage applied to the implantation apparatus. Thus, a P-type dopant such as boron of about $1 \times 10^{13}$ cm$^{-2}$ dose and 150 KeV energy may be utilized in a well-known manner. At this point, it should be appreciated that regions 30 are self-aligned by dielectric isolation regions 9, 10 of recessed oxide and, as will be shown hereinafter, regions 9, 10 cooperate in the formation of polycrystalline regions and single crystal regions which are effectively self-aligned by the presence of regions 9, 10. Thus, FIG. 3B shows a cross-sectional view of substrate 8 having doped regions 30 formed therein which are self-aligned by dielectric isolation regions 9, 10 of recessed oxide.

Figure 3C:
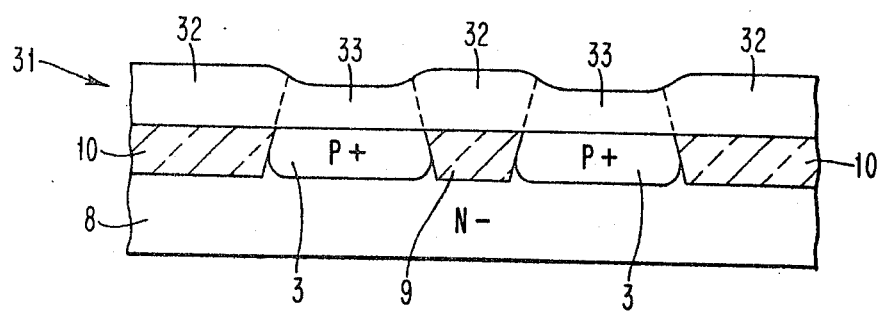

Referring now to FIG. 3C, there is shown a cross-sectional view of substrate 8 at a still later immediate stage in its method of fabrication. In FIG. 3C, substrate 8 is shown after a layer of silicon semiconductor has been deposited on isolation regions 9, 10 of recessed oxide and on the exposed portions of substrate 8 disposed therebetween. The layer of silicon semiconductor identified in FIG. 3 as layer 31 is deposited by chemical vapor deposition by the decomposition of Silane ($SiH_4$) at a temperature of approximately 850° to 1,000° C. The Silane may include dopant gases such as phosphine or arsine to provide for doping of deposited layer 31. An amount of dopant gas is included with the Silane which is sufficient to dope regions 33 to a level of $1·10^{16}$ to $1·10^{17}$ cm$^{-3}$. Reactant systems such as $SiCl_4$-$H_2$ may be used as an alternative to deposit silicon via the reaction $SiCl_4 + 2H_2 \rightleftarrows Si + 4HCl$. In addition, HCl may be added to control nucleation of polycrystalline silicon on oxide regions 9, 10 during epitaxial growth of silicon on 30 (33). Any other reactant systems know to produce poly/Epi growth on oxide/Si surfaces may be used. While the deposition of layer 31 is being carried out, ion implanted impurities in regions 30, under the influence of the 900°–1,000° C. temperature, diffuse into the region between dielectric isolation regions 9, 10 forming what has been previously identified in FIG. 1 as injectors or bit-lines 3. Because layer 31 encounters isolation regions 9, 10 of recessed oxide and single crystal regions 30 disposed therebetween, layer 31 contains two distinct regions 32, 33 which are polycrystalline silicon, and epitaxial silicon, respectively. It is well known that when depositions such as just described are carried out, that semiconductor deposited on silicon oxide is polycrystalline in character while that deposited on single crystal material is single crystal in character. At this point, it should be appreciated that as a result of the presence of isolation regions 9, 10 of recessed oxide that injectors 3 and single crystal regions 33 are self-aligned.

Figure 3D:
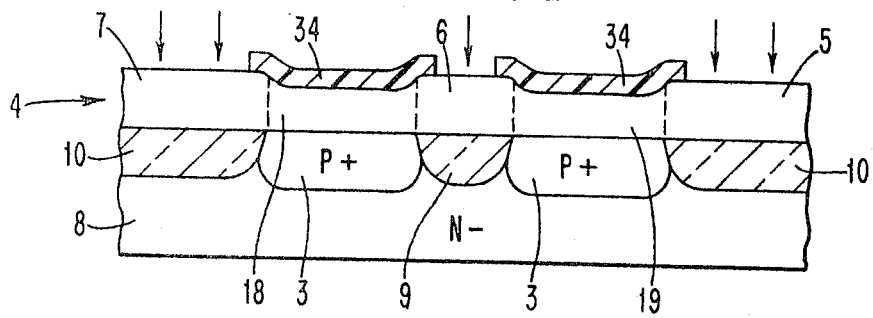

Referring now to FIG. 3D, substrate 8 is shown at a still later intermediate stage in its fabrication process. Because layer 31 as shown in FIG. 3 has insufficient dopant concentration to permit it to act as a highly conductive layer 4 or the word-line of memory cell 1, regions 32 of FIG. 3C must be heavily doped with an N-type dopant to a level above $1·10^{17}$ cm$^{-3}$ to render regions 32 highly conductive. This is achieved in FIG. 3D by providing diffusion masks 34 which permit regions 32 to be doped by introducing phosphorous from phosphine gas or by using a $POCl_3$ layer deposited over the entire surface, for example, in a manner well known to those skilled in the semiconductor art. Diffusion masks 34 are of silicon dioxide which was deposited, masked and etched using well-known photolithographic masking and etching techniques. The doping level of regions 33 is unaffected by the diffusion step while regions 32 are rendered highly conductive. Layer 31 now has the characteristics of what has been previously identified in FIG. 1A as layer 4; a layer of heavily doped, N-conductivity type silicon containing portions 5, 6, 7 which are N+ polycrystalline regions overlying isolation regions 9, 10 and N-conductivity type single crystal regions 18, 19 overlying injectors 3. Thus, what was layer 31 in FIG. 3C becomes layer 4 in FIG. 3D and what were regions 32 in FIG. 3C become portions 5, 6, 7 of layer 4 in FIG. 3D. Also, what were single crystal regions 33 in FIG. 3C become regions 18, 19 disposed atop injectors 3 in FIG. 3D. In FIG. 3D, after the diffusion of phosphorous is carried out, diffusion masks 34 are removed as by a dip etch in an appropriate etchant.

Figure 3E:
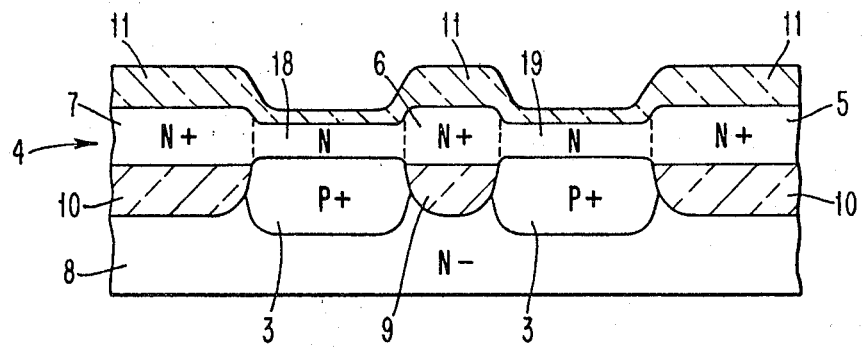

Referring now to FIG. 3E, substrate 8 and layer 4 are shown after an oxidation step has been carried out which oxidizes the surface of layer 4. The oxidation step is carried out using a thermal oxidation step which consists in heating substrate 8 in air or steam at a temperature of approximately 800° C.–900° C. The thermal oxidation step results in a layer of oxide being formed on the surface of layer 4 which has thicker semiconductor oxide regions 11 disposed over portions 5, 6, 7 of layer 4. Semiconductor oxide regions 11 are thicker because portions 5, 6, 7 which are polycrystalline in character are more highly doped than regions 18, 19. Highly doped regions oxidize at a faster rate than regions containing lower dopant levels. At this point, it should be appreciated that injectors 3, regions 18, 19 and the thin oxide region between isolation regions 11 of semiconductor oxide are all self-aligned and in registry.

Figure 3F:
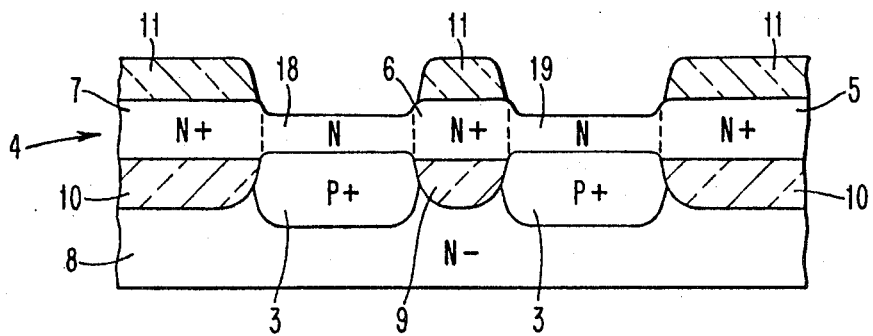

Referring now to FIG. 3F, substrate 8 is shown after a dip etch for an appropriate time has removed the thin oxide between regions 11 exposing the surface of regions 18, 19 which are disposed atop injectors 3. At this juncture, using well known photolithographic masking and etching techniques, devices 2 are formed by diffusing a P-type dopant into regions 18, 19 to form regions 16, 15, respectively. In a subsequent photolithographic masking, etching and diffusion step, an N-conductivity type dopant is diffused into regions 16, 15, forming regions 14, 17, respectively. These masking and diffusion steps are well known to those skilled in the semiconductor art so there is no need, at this time, to dwell on such details. In a subsequent step, interconnections 12, 13 cross-couple devices 2 in a manner described in detail in connection with FIG. 1A.

In an alternative approach which eliminates the dip etching step to provide the structure of FIG. 3F, the thin oxide regions between regions 11 of FIG. 3E can be immediately patterned using well-known photolithographic masking and etching techniques and appropriate dopants diffused into regions 18, 19 in sequence to form P-doped regions 15, 16 and N-doped regions 14, 17. Using this approach eliminates the dip etch step which provides the structure of FIG. 3F.

Regions 14, 17 are doped with phosphorous or arsenic to provide the desired concentration and have a resistivity of less than 0.5 kΩ per square. Regions 15, 16 are doped with boron to a desired concentration which results in a resistivity of 10 kΩ per square. Regions 18, 19 have a resistivity of 2 kΩ per square for a doping level of $1.5·10^{17}$ cm$^{-3}$ using 1 μm base width. Injectors 3 have a resistivity of less than 100Ω per square.

Figure 3G:
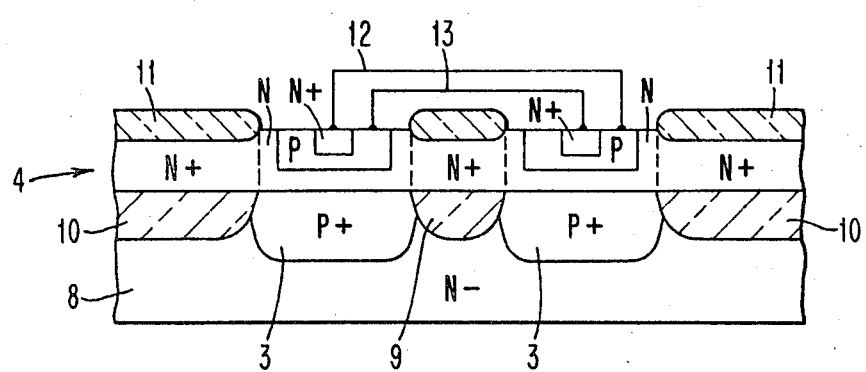

After the processing steps described in connection with FIGS. 3A–3F have been carried out, the structure of FIG. 3G results which is substantially identical with the structure shown in FIG. 1A. Considering these FIGS. in somewhat more detail, it should be noted that portion 6 of layer 4 which is polycrystalline in character and heavily doped N-type conductivity acts effectively as insulation electrically isolating regions 18, 19 of devices 2 from each other. Portion 6 acts effectively as insulation because holes introduced into portion 6 from regions 18, 19 are eliminated by recombination in portion 6. It should also be noted that recessed oxide regions 9, 10 effectively isolate injectors 3 from each other and from the injectors of adjacent memory cells 1 (not shown). Because injectors 3 have been buried, a number of benefits accrue to anyone who would use this structure and method of fabrication. One benefit is that the surface area of memory cell 1 relative to known memory cells has been reduced by half because injectors 3 have been removed from the surface of the cell and buried. Additional real estate in terms of substrate surface area is also saved because only two vias for contacts per pair of injectors 3 or bit-lines are required whereas, in the past, two vias for contacts were required for each memory cell in a prior art array. Semiconductor oxide region 9 not only prevents injectors 3 from merging together but also cuts down the sidewall capacitance of injectors 3.

All contacts to word-lines 4 and injectors 3 or bit-line can now be made at the edge of an array containing memory cells 1 by masking and etching reach-through vias in a well-known manner. Contact vias for cross-coupling interconnections 12, 13 are similarly provided. Metallization and contacts are provided in a well-known manner. It is, of course, understood that the P-regions of FIG. 1A may be substituted by N-regions and that the N-regions may be substituted for by P-regions without departing from the spirit of the present invention.

Having thus described our invention, what we claim as new, and desire to secure by Letters Patent is:

1. A vertical pair of complementary bipolar transistors comprising:
   a semiconductor substrate of one conductivity type,
   a pair of dielectric isolation regions disposed in contiguous relationship with said substrate,
   an injector region of opposite conductivity type disposed between said pair of isolation regions,
   a pair of heavily doped, polycrystalline semiconductor regions of said one conductivity type disposed over and in registry with said pair of isolation regions,
   a single crystal semiconductor region of said one conductivity type disposed over and in registry with said injector region, and,
   a first zone of said opposite conductivity type disposed in said single crystal region and a second zone of said one conductivity type disposed in said first zone.

2. A vertical pair of complementary bipolar transistors according to claim 1 further including another vertical pair of complementary bipolar transistors like those described in claim 37 disposed in electrically isolated spaced relationship with said vertical pair of bipolar, complementary transistors, one of each of said pairs of isolation regions and one of each of said pairs of polycrystalline regions being common, and,
   interconnection means cross-coupling a first zone of said vertical pair of complementary, bipolar transistors with a second zone of said another vertical pair of complementary, bipolar transistors and a second zone of said vertical pair of complementary, bipolar transistors with a first zone of said another vertical pair of complementary, bipolar transistors to form a flip-flop.

3. A vertical pair of complementary, bipolar transistors according to claim 2 further including means connected to a polycrystalline region of one of said pairs of transistors for simultaneously applying pulsed signals to said polycrystalline and said single crystal regions of said pair and said another pair of transistors, said polycrystalline regions forming a word-line interconnecting said single crystal regions, and,
   means connected to said injector regions of said pairs of transistors for applying pulsed signals to said injectors, said injectors being bit-lines for a memory cell formed by said flip-flop and said word-line.

4. A vertical pair of complementary, bipolar transistors according to claim 3 wherein said semiconductor substrate is silicon.

5. A vertical pair of complementary, bipolar transistors according to claim 3 wherein said isolation regions are oxides of said semiconductor.

6. A vertical pair of complementary, bipolar transistors according to claim 3 wherein said isolation regions are regions of recessed oxide of said semi-conductor.

7. A vertical pair of complementary, bipolar transistors according to claim 3 wherein said polycrystalline and single crystal semiconductor regions are silicon.

* * * * *

UNITED STATES PATENT AND TRADEMARK OFFICE
CERTIFICATE OF CORRECTION

PATENT NO. : 4,425,574

DATED : January 10, 1984

INVENTOR(S) : V.J. Silvestri, D.D. Tang and S.K. Wiedmann

It is certified that error appears in the above-identified patent and that said Letters Patent is hereby corrected as shown below:

Column 12, line 6, delete "37" and insert --1--

Signed and Sealed this

Twentieth Day of August 1985

[SEAL]

Attest:

DONALD J. QUIGG

Attesting Officer

Acting Commissioner of Patents and Trademarks